(12) United States Patent
Benoit et al.

(10) Patent No.: US 9,059,234 B2
(45) Date of Patent: Jun. 16, 2015

(54) FORMATION OF A HIGH ASPECT RATIO TRENCH IN A SEMICONDUCTOR SUBSTRATE AND A BIPOLAR SEMICONDUCTOR DEVICE HAVING A HIGH ASPECT RATIO TRENCH ISOLATION REGION

(71) Applicant: International Business Machines Corporation, Armonk, NY (US)

(72) Inventors: John J. Benoit, Williston, VT (US); James R. Elliott, Richmond, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/059,780

(22) Filed: Oct. 22, 2013

(65) Prior Publication Data
US 2015/0108549 A1 Apr. 23, 2015

(51) Int. Cl.
H01L 21/265 (2006.01)
H01L 21/306 (2006.01)
H01L 29/737 (2006.01)
H01L 29/66 (2006.01)
H01L 29/06 (2006.01)
H01L 21/465 (2006.01)
H01L 21/762 (2006.01)

(52) U.S. Cl.
CPC ...... H01L 29/7378 (2013.01); H01L 29/66242 (2013.01); H01L 29/0642 (2013.01); H01L 21/26506 (2013.01); H01L 21/30604 (2013.01); H01L 21/465 (2013.01); H01L 21/76237 (2013.01)

(58) Field of Classification Search
USPC .......................................................... 438/739
See application file for complete search history.

(56) References Cited

U.S. PATENT DOCUMENTS

| 5,783,966 | A | 7/1998 | Hill et al. |
| 6,864,560 | B2 | 3/2005 | Khater et al. |
| 7,037,798 | B2 | 5/2006 | Adam et al. |
| 7,045,407 | B2 * | 5/2006 | Keating et al. ................. 438/198 |

(Continued)

OTHER PUBLICATIONS

Choi, et al., A Novel Isolation Scheme Featuring Cavities in the Collector for a High-Speed 0.13um SiGe:C BiCMOS Technology, IEEE, 2007 Topical Meeting on Silicon Monolithic Integrated Circuits in RF Systems Conference, 2007, pp. 158-161.

*Primary Examiner* — Stephen W Smoot
(74) *Attorney, Agent, or Firm* — Gibb & Riley, LLC; Anthony J. Canale

(57) ABSTRACT

Disclosed is a trench formation technique wherein a first etch process forms an opening through a semiconductor layer into a semiconductor substrate and then a second etch process expands the portion of the opening within the substrate to form a trench. However, prior to the second etch, a doped region is formed in the substrate at the bottom surface of the opening. Then, the second etch is performed such that an undoped region of the substrate at the sidewalls of the opening is etched at a faster etch rate than the doped region, thereby ensuring that the trench has a relatively high aspect ratio. Also disclosed is a bipolar semiconductor device formation method. This method incorporates the trench formation technique so that a trench isolation region formed around a collector pedestal has a high aspect ratio and, thereby so that collector-to-base capacitance $C_{cb}$ and collector resistance $R_c$ are both minimized.

19 Claims, 14 Drawing Sheets

(56) References Cited

U.S. PATENT DOCUMENTS

| | | |
|---|---|---|
| 7,342,293 B2 | 3/2008 | Wallner et al. |
| 7,462,547 B2 | 12/2008 | Akatsu et al. |
| 7,777,255 B2 | 8/2010 | Rucker et al. |
| 2005/0023643 A1 | 2/2005 | Li et al. |
| 2009/0302375 A1 | 12/2009 | Sonsky et al. |
| 2011/0057266 A1 | 3/2011 | Wallner et al. |
| 2011/0198671 A1 | 8/2011 | Boccardi et al. |
| 2011/0215417 A1 | 9/2011 | Meunier-Beillard et al. |

* cited by examiner

FORMATION OF A HIGH ASPECT RATIO TRENCH IN A SEMICONDUCTOR SUBSTRATE AND A BIPOLAR SEMICONDUCTOR DEVICE HAVING A HIGH ASPECT RATIO TRENCH ISOLATION REGION

BACKGROUND

The methods and structures disclosed herein are related to high aspect ratio trenches for use, for example, in trench isolation regions of semiconductor devices (e.g., for bipolar semiconductor devices, such as bipolar junction transistors (BJTs) or heterojunction bipolar transistors (HBTs)) and, particularly, to a method of forming a high aspect ratio trench, to a method of forming a bipolar semiconductor device having a high aspect ratio trench isolation region and to the resulting bipolar semiconductor device structure.

Those skilled in the art will recognize that it is desirable in bipolar semiconductor devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic capacitances and resistances including, but are not limited to, parasitic collector-to-base capacitance $C_{cb}$ and parasitic collector resistance $R_c$. Reduction of the parasitic capacitances and resistances can result in a higher $f_{max}$. Thus, it would be advantageous to provide an improved bipolar semiconductor device, such as a bipolar junction transistor (BJT) or heterojunction bipolar transistor (HBT), in which collector-to-base capacitance $C_{cb}$ and collector resistance $R_c$ are both minimized as well as a method of forming such an improved bipolar semiconductor device.

SUMMARY

In view of the foregoing, disclosed herein is an improved technique for forming a trench for a trench structure (e.g., a trench isolation region) within a semiconductor substrate aligned below an opening in a semiconductor layer such that the trench has a relatively high aspect ratio (i.e., such that the trench has a width that is greater than its depth). With this technique, a first etch process is used to form an opening through the semiconductor layer into the semiconductor substrate. Then, a second etch process is used to expand the lower portion of the opening within the semiconductor substrate, thereby forming the trench. However, prior to performing the second etch process, a doped region is formed in the semiconductor substrate immediately adjacent to the bottom surface of the opening. Then, the second etch process is specifically performed such that an undoped region of the semiconductor substrate immediately adjacent to the sidewalls of the opening is etched at a faster etch rate than the doped region, thereby ensuring that the resulting trench has a relatively high aspect ratio. Also disclosed herein is a method of forming a semiconductor device and, particularly, a bipolar semiconductor device, such as a bipolar junction transistor (BJT) or heterojunction bipolar transistor (HBT). This method incorporates the above-mentioned trench formation technique when forming a trench isolation region around a collector pedestal so that the trench isolation region has a relatively high aspect ratio and, thereby so that collector-to-base capacitance $C_{cb}$ and collector resistance $R_c$ within the resulting bipolar semiconductor device are both minimized.

More particularly, disclosed herein is a method of forming a trench for a trench structure (e.g., for a trench isolation region) within a semiconductor substrate aligned below an opening in a semiconductor layer such that the trench has a relatively high aspect ratio (i.e., has a width that is greater than its depth). Specifically, the method can comprise providing a semiconductor substrate comprising a first semiconductor material and forming a semiconductor layer, comprising a second semiconductor material different from the first semiconductor material, on that semiconductor substrate. Next, the method can comprise performing a first etch process to form an opening extending vertically through the semiconductor layer into the semiconductor substrate such that the opening has sidewalls and a bottom surface within the semiconductor substrate. This first etch process can comprise, for example, an anisotropic etch process.

Then, a dopant implantation process can be performed in order to implant a dopant into the semiconductor substrate, thereby forming a doped region immediately adjacent to the bottom surface of the opening. This dopant implantation process can specifically be performed such that the region of the semiconductor substrate immediately adjacent to the sidewalls of the opening remains undoped.

After the dopant implantation process is performed, a second etch process (e.g., an isotropic etch process) can be performed to expand the lower portion of the opening within the semiconductor substrate, thereby forming a trench. However, this second etch process can specifically be performed such that the undoped region of the semiconductor substrate immediately adjacent to the sidewalls is etched at a faster etch rate than the semiconductor layer and the doped region. The faster etch rate of the undoped region ensures that, after the second etch process, the trench has a relatively high aspect ratio with the depth of the trench being less than the width of the trench.

Also disclosed herein is a method of forming a semiconductor device and, particularly, a bipolar semiconductor device, such as a bipolar junction transistor (BJT) or heterojunction bipolar transistor (HBT). This method incorporates the above-mentioned trench formation technique when forming a trench isolation region. Specifically, the method can comprise providing a semiconductor substrate comprising a first semiconductor material. A first semiconductor layer can be formed on the semiconductor substrate. This first semiconductor layer can comprise a second semiconductor material that is different from the first semiconductor material. Then, a second semiconductor layer can be formed on the first semiconductor layer. This second semiconductor layer can comprise the same first semiconductor material as the semiconductor substrate.

Subsequently, a first etch process (e.g., an anisotropic etch process) can be performed to form an opening that extends vertically through the second semiconductor layer and the first semiconductor layer into the semiconductor substrate such that the opening has sidewalls and a bottom surface within the semiconductor substrate.

Then, a dopant implantation process can be performed to implant a dopant into the semiconductor substrate, thereby forming a doped region immediately adjacent to the bottom surface of the opening. This dopant implantation process can specifically be performed such that the region of the semiconductor substrate immediately adjacent to the sidewalls of the opening remains undoped. After the dopant implantation process is performed, a second etch process (e.g., an isotropic etch process) can be performed to expand the lower portion of the opening within the semiconductor substrate, thereby forming a trench. However, this second etch process can specifically be performed such that the second semiconductor layer and the undoped region of the semiconductor substrate immediately adjacent to the sidewalls are etched at a faster etch rate than the first semiconductor layer and the doped region. The faster etch rate of the undoped region ensures that, after the second etch process, the trench has a relatively high aspect ratio with the depth of the trench being less than the width of the trench.

After the trench is formed, it can be filled with at least one isolation material in order to form a trench isolation region. The isolation material(s) can also fill the opening within the first semiconductor layer.

It should be understood that in addition to the process steps described above, conventional bipolar semiconductor device processing steps can be performed in order to form three discrete terminal regions for the device within the semiconductor substrate, the first semiconductor layer and the second semiconductor layer. For example, before the first semiconductor layer is formed, a first terminal region (e.g., a collector region) for the bipolar semiconductor device can be formed in the semiconductor substrate and the trench for the trench isolation region can subsequently be formed so as to be positioned laterally adjacent to that first terminal region and, particularly, so as to define a relatively narrow first terminal pedestal (e.g., a collector pedestal) immediately adjacent to the top surface of the semiconductor substrate. Furthermore, a second terminal region (e.g., a base region) for the bipolar semiconductor device can be formed in the first semiconductor layer such that the second terminal region is aligned above the first terminal region. Specifically, this second terminal region can be formed so as to have a center portion (e.g., an intrinsic base portion) aligned above the first terminal pedestal and an edge portion (e.g., an extrinsic base portion), which is adjacent to the center portion and which is undercut by the trench. Additionally, a third terminal region (e.g., an emitter region) for the bipolar semiconductor device can be formed in the second semiconductor layer such that the third terminal region is aligned above the center portion of the second terminal region. In such a bipolar semiconductor device, the trench isolation region with the relatively high aspect ratio ensures that collector-to-base capacitance $C_{cb}$ and collector resistance $R_c$ are both minimized.

Also disclosed herein is a bipolar semiconductor device, such as a bipolar junction transistor (BJT) or heterojunction bipolar transistor (HBT), formed according to the method described above. Specifically, this bipolar semiconductor device can comprise a semiconductor substrate and a first terminal region (e.g., a collector region) in the semiconductor substrate.

The bipolar semiconductor device can further comprise a second terminal region (e.g., a base region) in a first semiconductor layer on the semiconductor substrate. The second terminal region can comprise a center portion (e.g., an intrinsic base portion) and an edge portion (e.g., an extrinsic base portion). The second terminal region can be aligned vertically above the first terminal region.

The bipolar semiconductor device can further comprise a third terminal region (e.g., an emitter region) in a second semiconductor layer on the first semiconductor layer. This third terminal region can be aligned vertically above the center portion of the second terminal region.

The bipolar semiconductor device can further comprise an opening in the first semiconductor layer and a trench within the semiconductor substrate aligned below the opening. Specifically, the opening can extend vertically through the first semiconductor layer and can be further positioned laterally adjacent to the second terminal region. The trench can be in the semiconductor substrate aligned below the opening and can further be positioned laterally adjacent to the first terminal region. Specifically, this trench can be wider than the opening such that it undercuts the edge portion of the second terminal region in the first semiconductor layer and such that it defines a relatively narrow first terminal pedestal (e.g., a collector pedestal) at the top surface of the semiconductor substrate aligned below the center portion of the second terminal region. This trench can further have a relatively high aspect ratio. That is, the depth of the trench can be less than its width.

One or more isolation materials can fill the trench, thereby forming a trench isolation region. The isolation material(s) can also fill the opening in the first semiconductor layer above the trench.

Finally, the bipolar semiconductor device can further comprise a doped region in the semiconductor substrate aligned below and immediately adjacent to a bottom surface of the trench. In such a bipolar semiconductor device, the trench isolation region with the relatively high aspect ratio ensures that collector-to-base capacitance $C_{cb}$ and collector resistance $R_c$ are both minimized.

BRIEF DESCRIPTION OF THE DRAWINGS

The structures and method disclosed herein will be better understood from the following detailed description with reference to the drawings, which are not necessarily drawn to scale and in which.

DETAILED DESCRIPTION

As mentioned above, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic capacitances and resistances including, but are not limited to, parasitic collector-to-base capacitance $C_{cb}$ and parasitic collector resistance $R_c$. Reduction of the parasitic capacitances and resistances can result in a higher $f_{max}$. Recently, bipolar semiconductor devices have been developed with trench isolation regions that help to reduce collector-to-base capacitance $C_{cb}$.

Figure 1:
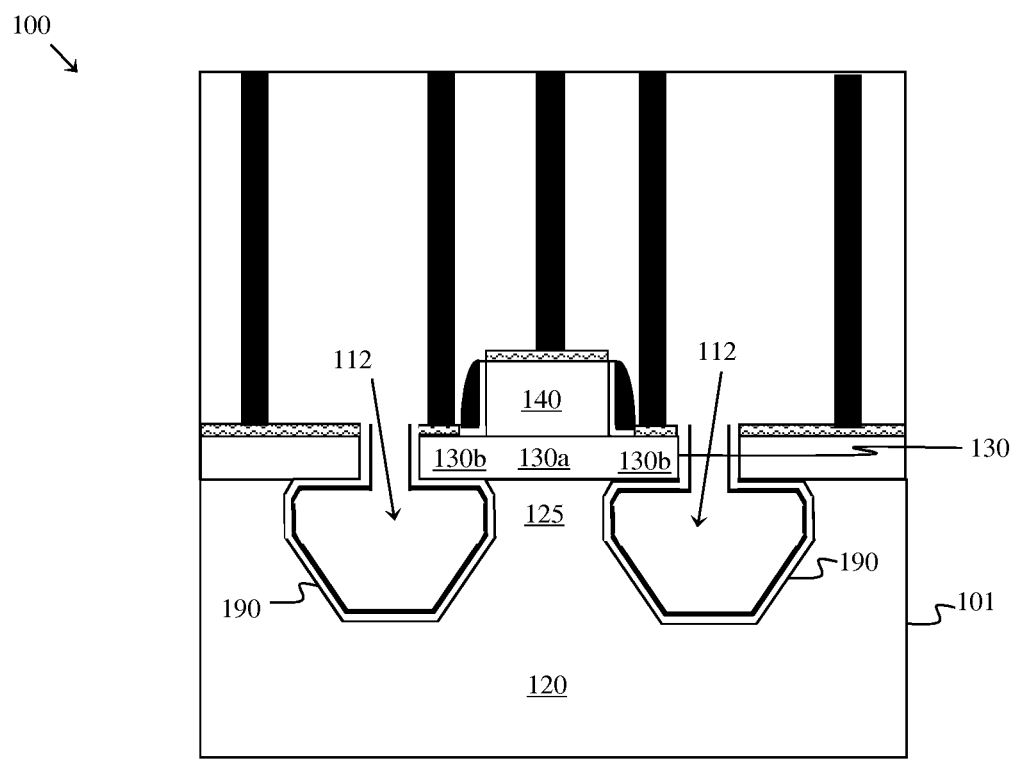
FIG. 1 is a cross-section diagram illustrating a bipolar semiconductor device having a trench isolation region.

For example, as illustrated in FIG. 1, a bipolar semiconductor device 100 can comprise a semiconductor substrate 101 and a collector region 120 within the semiconductor substrate 101. The bipolar semiconductor device 100 can further comprise a base layer 130 on the top surface of the semiconductor substrate 101 and an emitter layer 140 on the base layer 130. Specifically, the base layer 130 can comprise an intrinsic base portion 130a and an extrinsic base portion 130b positioned laterally adjacent to the intrinsic base portion 130a. The emitter layer 140 can be aligned vertically above the intrinsic base portion 130a. Additionally, a trench isolation region 190 can be within the semiconductor substrate 101 adjacent to a collector region 120. This trench isolation region 190 can comprise an isolation material-filled trench 112 that undercuts the extrinsic base portion 130b of the base layer 130. By undercutting the extrinsic base portion 130b of the base layer 130, the trench isolation region 190 effectively creates a relatively narrow collector pedestal 125 at the top surface of the semiconductor substrate 101 and extending vertically from the intrinsic base portion 130a to the collector region 120, thereby reducing collector-to-base capacitance $C_{cb}$. However, current techniques for forming the trench 112 for the trench isolation region 190 create a trench 112 having a relatively low aspect ratio (i.e., the width of the trench 112 is approximately equal to or less than the depth) and, particularly, create a trench 112 that is both relatively wide and relatively deep. As a result, the distance current must flow through the collector region 120 increases, thereby increasing collector resistance $R_c$.

In view of the foregoing, disclosed herein is an improved technique for forming a trench within a semiconductor substrate aligned below an opening in a semiconductor layer such the trench has a relatively high aspect ratio (i.e., such that the trench has a width that is greater than its depth). With this technique, a first etch process (e.g., an anisotropic etch process) is used to form an opening through the semiconductor layer into the semiconductor substrate. Then, a second etch process (e.g., an isotropic etch process) is used to expand the lower portion of the opening within the semiconductor substrate, thereby forming the trench. However, prior to performing the second etch process, a doped region is formed in the semiconductor substrate immediately adjacent to the bottom surface of the opening. Then, the second etch process is specifically performed such that an undoped region of the semiconductor substrate immediately adjacent to the sidewalls of the opening is etched at a faster etch rate than the doped region, thereby ensuring that the resulting trench has a relatively high aspect ratio. Also disclosed herein is a method of forming a semiconductor device and, particularly, a bipolar semiconductor device, such as a bipolar junction transistor (BJT) or heterojunction bipolar transistor (HBT). This method incorporates the above-mentioned trench formation technique when forming a trench isolation region around a collector pedestal so that the trench isolation region has a relatively high aspect ratio and, thereby so that collector-to-base capacitance $C_{cb}$ and collector resistance $R_c$ within the resulting bipolar semiconductor device are both minimized.

Figure 2:
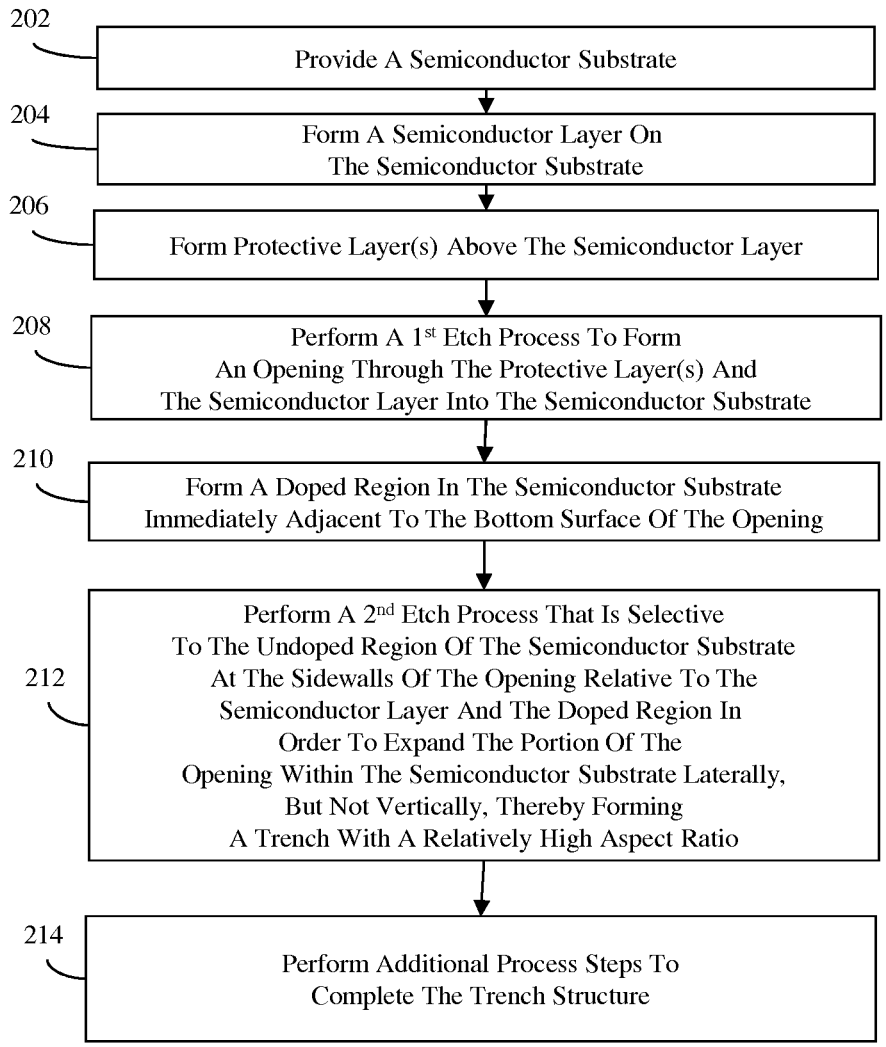
FIG. 2 is a flow diagram illustrating a method of forming a trench for a trench structure in a semiconductor substrate.
Figure 3:
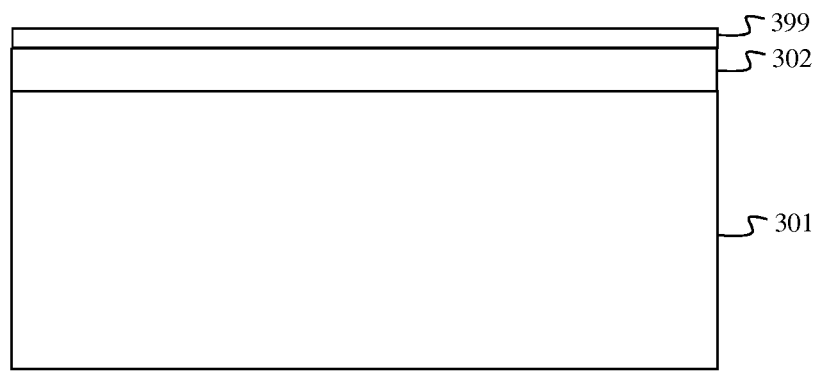
FIG. 3 is a cross-section diagram illustrating a partially completed structure formed according to the flow diagram of FIG. 2.

More particularly, FIG. 2 is a flow diagram illustrating a method of forming a trench for a trench structure (e.g., for a trench isolation region or for any other trench structure, such as a trench capacitor) within a semiconductor substrate aligned below an opening in a semiconductor layer such that the trench has a relatively high aspect ratio (i.e., has a width that is greater than its depth). Specifically, the method can comprise providing a semiconductor substrate 301 (202, see FIG. 3). This semiconductor substrate 301 can comprise a bulk semiconductor substrate, as illustrated in FIG. 3. Alternatively, the semiconductor substrate 301 can comprise a semiconductor-on-insulator (SOI) wafer (not shown). In any case, the semiconductor substrate 301 (or in the case of an SOI wafer, the top layer of the SOI wafer) can comprise a first semiconductor material, such as monocrystalline silicon or any other suitable semiconductor material.

The method can further comprise forming a semiconductor layer 302 on that semiconductor substrate 301 (204, see FIG. 3). This semiconductor layer 302 can be formed, for example, by using an epitaxial deposition process or any other suitable deposition process. In any case, this semiconductor layer 302 can comprise a second semiconductor material that is different from the first semiconductor material. The difference between the first semiconductor material and second semiconductor material can be, for example, a difference in chemical composition and/or a difference in crystalline structure such that the first semiconductor material can be selectively etched over the second semiconductor material. For example, if the first semiconductor material comprises monocrystalline silicon, the second semiconductor material can comprise silicon germanium, silicon carbide, silicon germanium carbide, polycrystalline silicon, etc.

The method can further comprise forming one or more protective layers 399 above the semiconductor layer 302 (206, see FIG. 3). The protective layer(s) 399 can be formed such that the uppermost protective layer comprises a dielectric cap layer, such as a silicon nitride layer. Techniques for forming and, particularly, for depositing such protective layer(s) may vary depending upon the type of material used. For example, a silicon nitride layer can be deposited by chemical vapor deposition (CVD) or plasma-enhanced chemical vapor deposition (PECVD).

Figure 4:
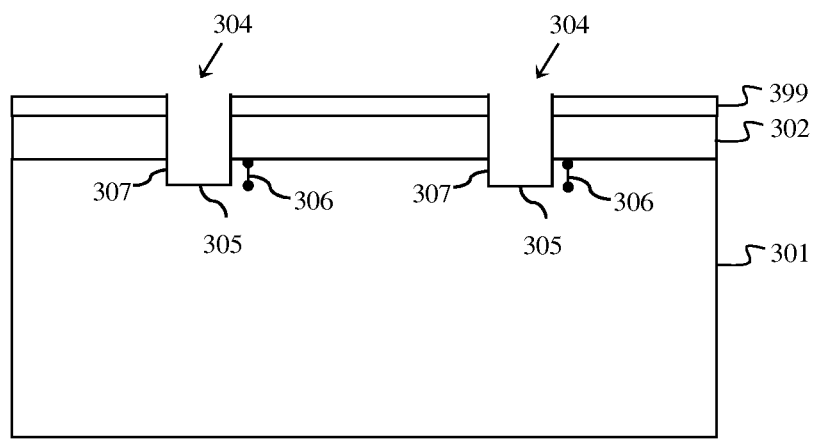
FIG. 4 is a cross-section diagram illustrating a partially completed structure formed according to the flow diagram of FIG. 2.

Next, the method can comprise performing a first etch process to form an opening 304 that extends vertically through the protective layer(s) 399 and the semiconductor layer 302 and into the semiconductor substrate 301 (208, see FIG. 4). This opening 304 can be formed, for example, using conventional lithographical patterning and anisotropic etch processes. This opening 304 can further be formed such that it extends a predetermined depth 306 into the semiconductor substrate 301 (e.g., as measured from the bottom surface 311 of the semiconductor layer 302) and, thus, such that the lower portion of the opening 304 has sidewalls 307 and a bottom surface 305 within the semiconductor substrate 301.

Figure 5:
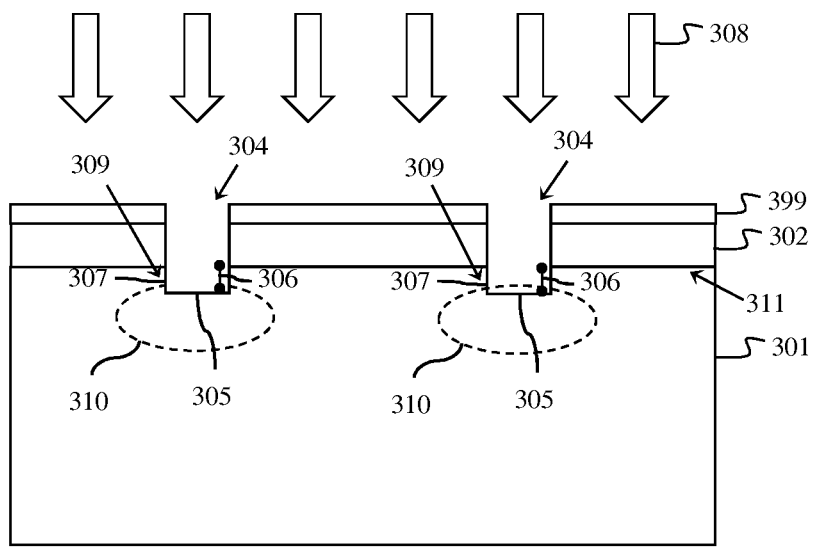
FIG. 5 is a cross-section diagram illustrating a partially completed structure formed according to the flow diagram of FIG. 2.

Once the opening 304 is formed, a dopant implantation process can be performed in order to implant a dopant 308 into the semiconductor substrate 301 and, thereby form a doped region 310 immediately adjacent to the bottom surface 305 of the opening 304 (210, see FIG. 5). This dopant implantation process can specifically be performed such that the region 309 of the semiconductor substrate 301 immediately adjacent to the sidewalls 307 of the lower portion of the opening 304 remains undoped. The dopant 308 can be preselected so as to change the chemical composition and/or the crystalline structure of the doped region 310 relative to the remaining portion of the semiconductor substrate 301 and, particularly, relatively to the undoped region 309 of the semiconductor substrate 301 immediately adjacent to the sidewalls 307, thereby allowing that undoped region 309 to subsequently be selectively etched over both the doped region 310 and the semiconductor layer 302 at process 212 discussed in detail below.

For example, if the semiconductor substrate 301 comprises silicon and the semiconductor layer 302 comprises silicon germanium, the dopant 308 selected for forming the doped region 310 can comprise germanium. In this case, the silicon in the undoped region 309 can be selectively etched over the silicon germanium in both the doped region 310 and the semiconductor layer 302. Alternatively, the dopant 308 selected for forming the doped region 310 can comprise an inert dopant (e.g., silicon, argon, krypton, nitrogen, xenon, neon, carbon, etc.). In this case the implantation process can be performed so that the doped region 310 is amorphized (i.e., so that the doped region 310 has an amorphous crystalline structure) and so that the monocrystalline silicon of the undoped region 309 can subsequently be selectively etched over the amorphous crystalline material of the doped region 310 as well as the different semiconductor material of the semiconductor layer 302. It should be noted that the protective layer(s) 399 will protect the top surface of the semiconductor layer 302 from dopant implantation during this process 210. Alternatively, the dopant 308 can comprise a dopant associated with either N-type or P-type conductivity (e.g., arsenic or boron, respectively) as long as the undoped region 309 can be selectively etched over the doped region 310.

Figure 6:
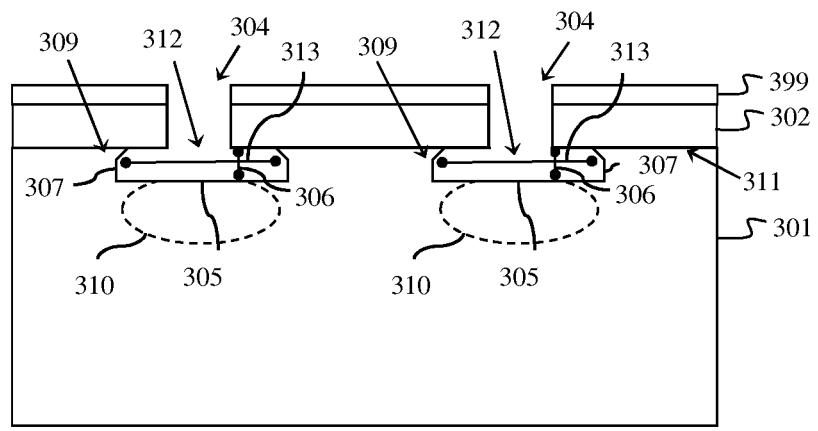
FIG. 6 is a cross-section diagram illustrating a partially completed structure formed according to the flow diagram of FIG. 2.

After the dopant implantation process is performed at process 210, a second etch process (e.g., an isotropic etch process) can be performed to expand the lower portion of the opening 304 within the semiconductor substrate 301, thereby forming a trench 312 (212, see FIG. 6). However, this second etch process can specifically be performed such that the undoped region 309 of the semiconductor substrate 301 immediately adjacent to the sidewalls 307 is etched at a faster etch rate than the semiconductor layer 302 and the doped region 310 (i.e., such that the undoped region 309 is selectively etched over the semiconductor layer 302 and the doped region 310), thereby expanding the portion of the opening 304 within the semiconductor substrate 301 laterally, but not vertically. Thus, this faster etch rate of the undoped region 309 ensures that, after the second etch process 212, the trench 312 undercuts the semiconductor layer 302 and also has a relatively high aspect ratio with the depth 306 of the trench 312 remaining essentially unchanged and being less than its width 313.

Those skilled in the art will recognize that the specifications for the second etch process 212 used to selectively etch the undoped region 309 over the semiconductor layer 302 and doped region 310 will vary depending upon the chemical composition and/or crystalline structures of the undoped region 309 as compared to the semiconductor layer 302 and doped region 310. In any case, the specifications for this second etch process can be preselected to ensure etch selectivity of the undoped region 309 over the semiconductor layer 302 and doped region 310 of approximately 5:1 to 200:1. For example, in the case where the semiconductor substrate 301 comprises silicon, the semiconductor layer 302 comprises silicon germanium and the dopant 308 comprises germanium, the selective etch process used to form the trench 312 can comprise a wet chemical etching process that uses an etchant, such as tetramethylammonium hydroxide (TMAH), ammonium hydroxide ($NH_4OH$), ethylenediamine pyrocatechol (EDP), potassium hydroxide (KOH), or any other suitable etchant capable of selectively etching silicon over silicon germanium.

Figure 7:
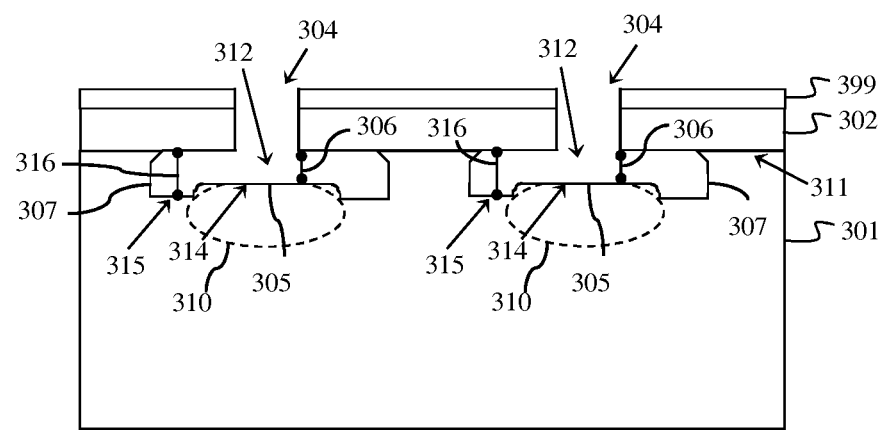
FIG. 7 is a cross-section diagram illustrating a partially completed structure formed according to the flow diagram of FIG. 2.

It should be noted that depending upon the specifications used for this second etch process 212 and, particularly, depending upon the amount of time the sidewalls 307 of the opening 304 within the semiconductor substrate 301 are exposed to the particular etchant used such that those sidewalls 307 are etched laterally to or beyond the boundaries of the doped region 310, the shape of the trench 312 may vary. For example, if the sidewalls 307 of the lower portion of the opening 304 within the semiconductor substrate 301 are only exposed to the etchant until such time as the trench 312 extends laterally to or just beyond the boundaries of the doped region 310, essentially no vertical etch will occur and the bottom surface 305 of the trench 312 will have an essentially uniform depth 306, as shown in FIG. 6. However, if the sidewalls 307 of the lower portion of the opening 304 within the semiconductor substrate 301 are exposed to the etchant for some time after the trench 312 extends laterally beyond the boundaries of the doped region 310, at least some vertical etch will occur at the outer edges of the trench 312 such that the bottom surface 305 of the trench 312 will have a non-uniform depth, as shown in FIG. 7. Specifically, the trench 312 will have a center portion 314 extending a first depth 306 into the semiconductor substrate 301 and edges portions 315 extending a second depth 316 into the semiconductor substrate 301, where the second depth 316 is greater than the first depth 306. In any case, the second depth 316 (i.e., the maximum depth) of the trench 312 will still be less than the width 313 such that a relatively high aspect ratio is maintained.

After the trench 312 is formed, additional processing steps can be performed in order to complete a trench structure (e.g., to complete a trench isolation region, to complete a trench capacitor, etc.) using the trench 312 (214). For example, in the case of a trench isolation region, one or more isolation materials can be deposited so as to line (optionally) and fill the trench 312. Techniques for forming such trench structures following trench formation are well known in the art and, thus, the details are omitted from this specification in order to allow the reader to focus on the salient aspects of the disclosed method.

Figure 8:
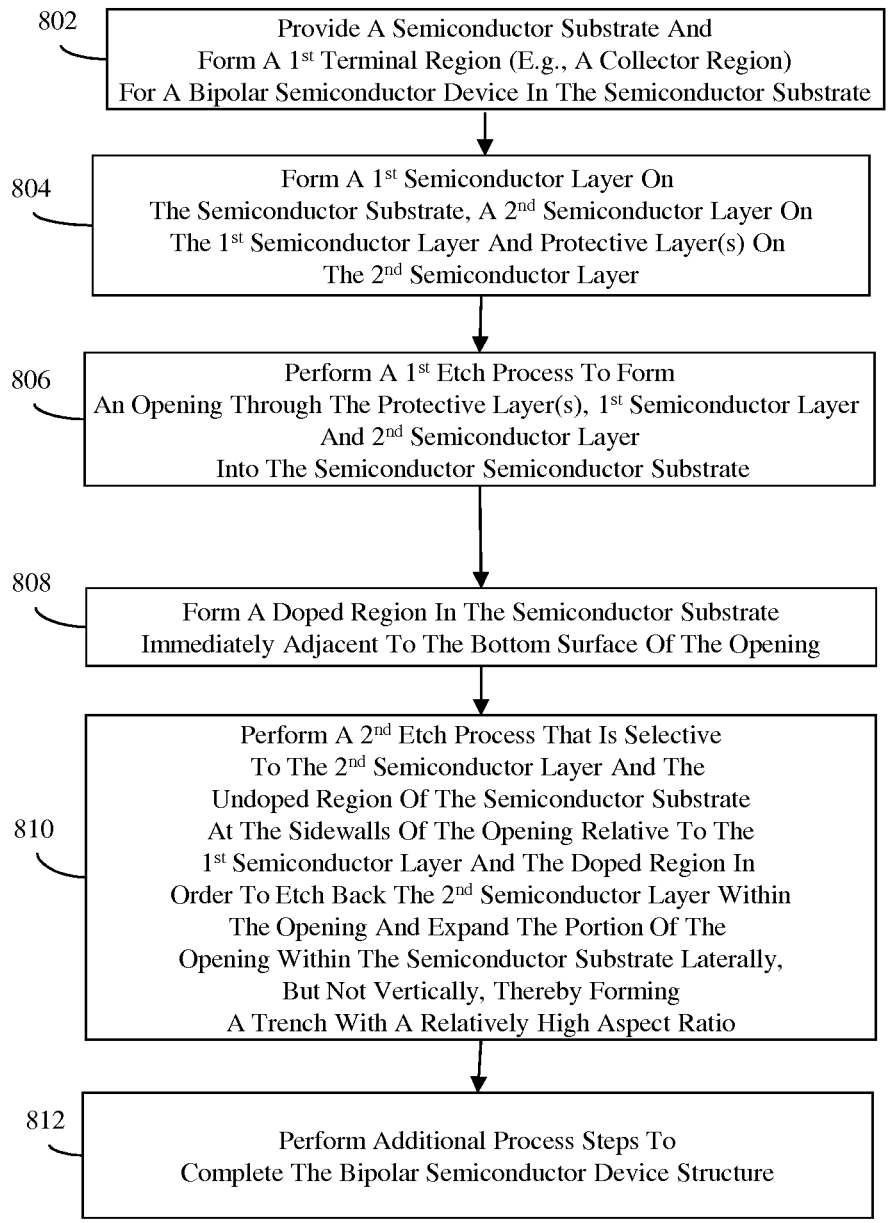
FIG. 8 is a flow diagram illustrating a method of forming a bipolar semiconductor device.

Referring to the flow diagram of FIG. 8, also disclosed herein is a method of forming a semiconductor device and, particularly, a bipolar semiconductor device, such as a bipolar junction transistor (BJT) or heterojunction bipolar transistor (HBT). This method incorporates the above-mentioned trench formation technique when forming a trench isolation region.

Figure 9:
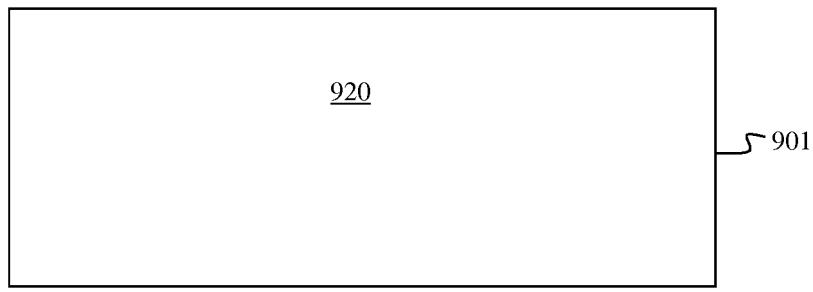
FIG. 9 is a cross-section diagram illustrating a partially completed structure formed according to the flow diagram of FIG. 8.

Specifically, the method can comprise providing a semiconductor substrate 901 and forming a first terminal region 920 (e.g., a collector region) in that semiconductor substrate 901 (802, see FIG. 9). This semiconductor substrate 901 can comprise a bulk semiconductor substrate, as illustrated in FIG. 9. Alternatively, the semiconductor substrate 901 can comprise a semiconductor-on-insulator (SOI) wafer (not shown). In any case, the semiconductor substrate 901 (or in the case of an SOI wafer, the top layer of the SOI wafer) can comprise a first semiconductor material (e.g., monocrystalline silicon or any other suitable semiconductor material) having a first type conductivity (e.g., a P-type conductivity). Thus, for example, the semiconductor substrate 901 can comprise a P-silicon substrate (i.e., a silicon substrate having a relatively low concentration of a P-type dopant). Additionally, a first terminal region 920 (e.g., a collector region) can be formed within this semiconductor substrate 901. The first terminal region 920 can be formed, for example, using a dopant implantation process such that the first terminal region 920 comprises a well region having a second type conductivity that is different from the first type conductivity (e.g., such that it comprises an N-well region having an N-type conductivity).

Figure 10:
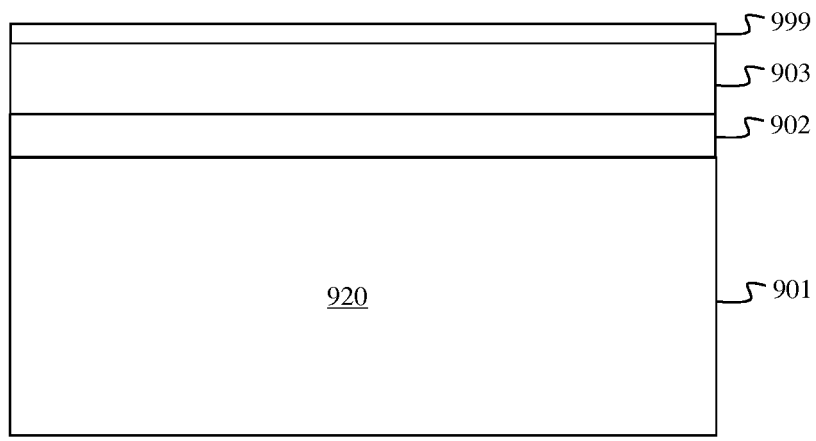
FIG. 10 is a cross-section diagram illustrating a partially completed structure formed according to the flow diagram of FIG. 8.

A first semiconductor layer 902 can be formed on the semiconductor substrate 901, a second semiconductor layer 903 can be formed on the first semiconductor layer 902 and at least one protective layer 999 can be formed on the second semiconductor layer 903 (806, see FIG. 10). Specifically, the first semiconductor layer 902 can be formed, for example, by using an epitaxial deposition process or any other suitable semiconductor deposition process. In any case, this first semiconductor layer 902 can comprise a second semiconductor material that is different from the first semiconductor material. The difference between the first semiconductor material and second semiconductor material can be, for example, a difference in chemical composition such that the first semiconductor material can be selectively etched over the second semiconductor material. For example, if the first semiconductor material of the semiconductor substrate 901 comprises monocrystalline silicon, the second semiconductor material of the first semiconductor layer 902 can comprise silicon germanium, silicon carbide, or silicon germanium carbide. This first semiconductor layer 902 can be deposited such that remains undoped (i.e., such that it is not doped with either a N-type or P-type dopant). Alternatively, this first semiconductor layer 902 can be in-situ doped or subsequently implanted with a relatively low concentration of a first type conductivity dopant (e.g., a P-type dopant) and, thereby such that it has the same type conductivity as the semiconductor substrate 901 (e.g., P-type conductivity). Alternatively, this first semiconductor layer 902 can be in-situ doped or subsequently implanted so that it has a relatively thin un-doped lower portion that it has neither N-type, nor P-type conductivity and an upper portion that is doped with a relatively low concentration of a first type conductivity dopant (e.g., a P-type dopant).

The second semiconductor layer 903 can similarly be formed by using an epitaxial deposition process or any other suitable semiconductor deposition process. In any case, this second semiconductor layer 903 can comprise, for example, the same first semiconductor material as the semiconductor substrate 901. This second semiconductor layer 903 can be in-situ doped or subsequently implanted with a second type conductivity dopant (e.g., an N-type dopant) and, thereby such that it has the same type conductivity as the first terminal region 920 within the semiconductor substrate 901 (e.g., N-type conductivity).

The protective layer(s) 999 can be formed such that the uppermost protective layer comprises a dielectric cap layer, such as a silicon nitride layer. Techniques for forming and, particularly, for depositing such protective layer(s) may vary depending upon the type of material used. For example, a silicon nitride layer can be deposited by chemical vapor deposition (CVD) or plasma-enhanced chemical vapor deposition (PECVD).

Figure 11:
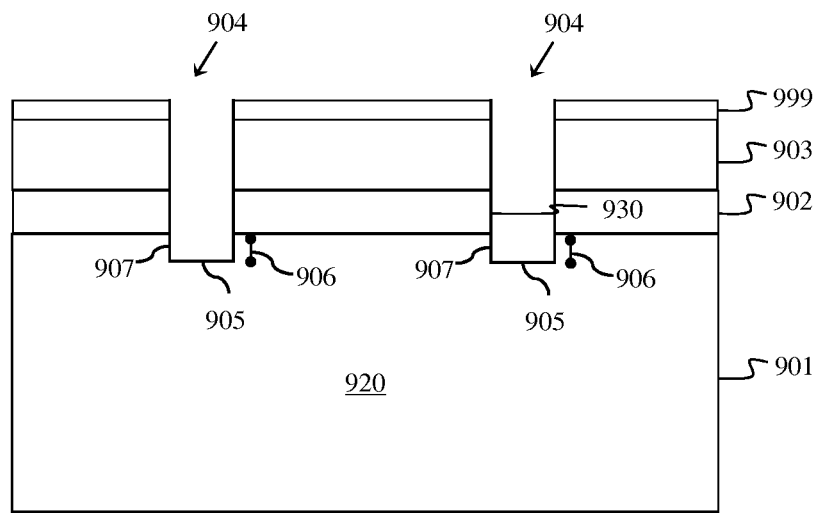
FIG. 11 is a cross-section diagram illustrating a partially completed structure formed according to the flow diagram of FIG. 8.

Next, the method can comprise performing a first etch process to form an opening 904 that extends vertically through the protective layer(s) 999, the second semiconductor layer 903 and the first semiconductor layer 902 and into the semiconductor substrate 901 (806, see FIG. 11). This opening 904 can be formed, for example, using conventional lithographical patterning and anisotropic etch processes. This opening 904 can further be formed such that it extends a predetermined depth 906 into the semiconductor substrate 901 (e.g., as measured from the bottom surface 911 of the first semiconductor layer 902) and, thus, such that a lower portion of the opening 904 has sidewalls 907 and a bottom surface 905 within the semiconductor substrate 901. This opening 904 can be patterned so that it laterally surrounds and defines the boundaries of the active region of the bipolar semiconductor device being formed and, particularly, the boundaries of a second terminal region 930 (e.g., a base region) within the first semiconductor layer 902. For example, the opening 904 can be patterned to define a second terminal region 930 and, particularly, a base region having a width of approximately 1.2 µm.

Figure 12:
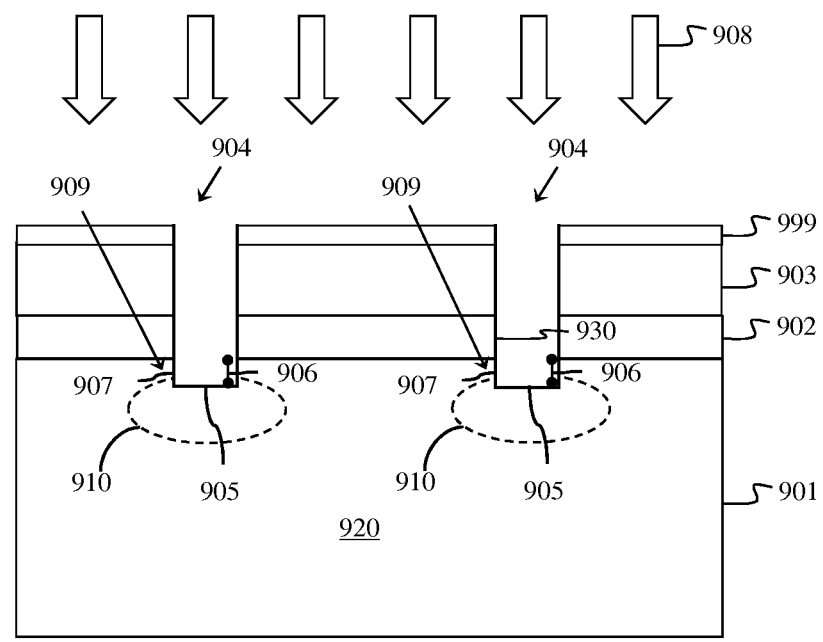
FIG. 12 is a cross-section diagram illustrating a partially completed structure formed according to the flow diagram of FIG. 8.

Once the opening 904 is formed, a dopant implantation process can be performed in order to implant a dopant 908 into the semiconductor substrate 901, thereby forming a doped region 910 immediately adjacent to the bottom surface 905 of the opening 304 (808, see FIG. 12). This dopant implantation process can specifically be performed such that the region 909 of the semiconductor substrate 901 immediately adjacent to the sidewalls 907 of the lower portion of the opening 904 remains undoped. The dopant 908 can be preselected so as to change the chemical composition and/or the crystalline structure of the doped region 910 relative to the remaining portion of the semiconductor substrate 901 and, particularly, relatively to the undoped region 909 of the semiconductor substrate 901 immediately adjacent to the sidewalls 907, thereby allowing the second semiconductor layer 903 and the undoped region 909 to subsequently be selectively etched over both the doped region 910 and the first semiconductor layer 902 at process 810 described in detail below.

For example, if the semiconductor substrate 901 and second semiconductor layer 903 comprise silicon and the first semiconductor layer 902 comprises silicon germanium, the dopant 908 selected for forming the doped region 910 can comprise germanium. In this case, the silicon in the second semiconductor layer 903 and the undoped region 909 of the semiconductor substrate 901 can be selectively etched over the silicon germanium in the first semiconductor layer 902 and the doped region 910. Alternatively, the dopant 908 could comprise, for example, boron or an inert dopant (e.g., silicon, argon, krypton, nitrogen, xenon, neon, carbon, etc.) that would allow the undoped region 909 to be selectively etched over the doped region 910. Alternatively, the dopant 908 can comprise a dopant associated with either N-type or P-type conductivity (e.g., arsenic or boron, respectively) as long as the undoped region 909 can be selectively etched over the doped region 910.

Figure 13:
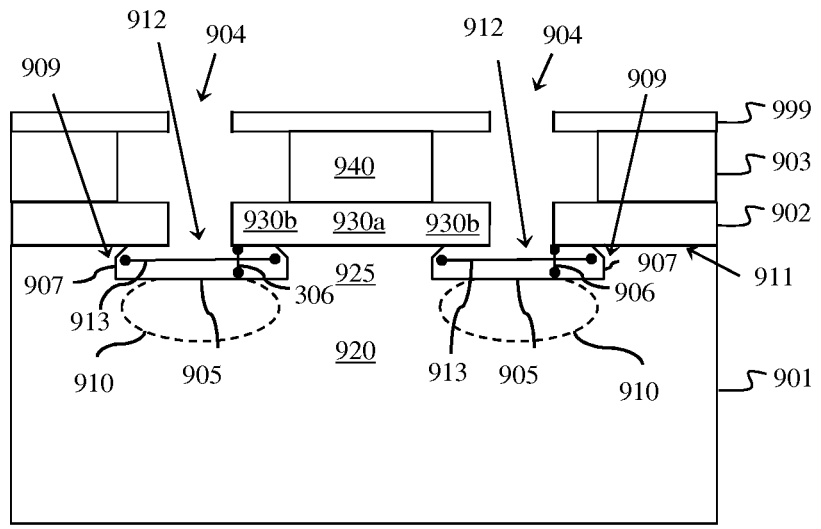
FIG. 13 is a cross-section diagram illustrating a completed trench formed according to the flow diagram of FIG. 8.

After the dopant implantation process is performed at process 808, a second etch process (e.g., an isotropic etch process) can be performed in order to expand the lower portion of the opening 904 within the semiconductor substrate 901, thereby forming a trench 912 (810, see FIG. 13). This second etch process can simultaneously be performed so at to etch back the exposed sidewalls of the second semiconductor layer 903 within the opening 904. Specifically, this second etch process can be performed such that the undoped region 909 of the semiconductor substrate 901 immediately adjacent to the sidewalls 907 in the lower portion of the opening and the second semiconductor layer 903 are etched at a faster etch rate than the first semiconductor layer 902 and the doped region 910 (i.e., such that the undoped region 909 and the second semiconductor layer 903 are selectively etched over the first semiconductor layer 902 and the doped region 910). As a result, the lower portion of the opening 904 within the semiconductor substrate 901 can be expanded laterally, without also expanding it vertically, such that, after the second etch process 810, the trench 912 will undercut the first semiconductor layer 902 by a desired amount (e.g., by approximately 0.4 µm) and still be relatively shallow. That is, the trench 912 will have a relatively high aspect ratio with the depth 906 of the trench 912 remaining essentially unchanged and being less than its width 913. This trench 912 will further define a narrow first terminal pedestal 925 (e.g., a narrow collector pedestal) at the top surface of the semiconductor substrate 901 adjacent to a center portion of the second terminal region 930 (e.g., adjacent to a center portion of the base region). That is, the trench 912 will be positioned laterally adjacent to and, more particularly, will laterally surrounds a portion of the first terminal region 920 at the top surface of the semiconductor substrate 901 and this portion of the first terminal region 920 is referred to herein as a pedestal 925.

It should be noted that the second semiconductor layer 903 will be etched back a similar distance (e.g., approximately 0.4 µm) at process 810. Etching back the second semiconductor layer 903 in this manner defines the boundaries and, particularly, the width (e.g., of approximately 0.4 µm) of a third terminal region 940 (e.g., an emitter region) and further defines an intrinsic base portion 930a of the base region 930, which is aligned vertically between the pedestal 925 and the third terminal region 940, and an extrinsic base portion 930b of the base region 930, which extends laterally beyond the third terminal region 940 and which is undercut by the trench 912.

Those skilled in the art will recognize that the specifications for the second etch process 810 used to selectively etch the undoped region 909 and the second semiconductor layer 903 over the doped region 910 and first semiconductor layer 902 will vary depending upon the chemical composition and/or crystalline structures of the undoped region 909 and the second semiconductor layer 903 as compared to the doped region 910 and first semiconductor layer 902. In any case, the specifications for this second etch process can be preselected to ensure etch selectivity of the undoped region 909 over the first semiconductor layer 902 and doped region 910 of approximately 5:1 to 200:1. For example, in the case where the semiconductor substrate 901 and second semiconductor layer 903 comprise silicon, the first semiconductor layer 902 comprises silicon germanium and the dopant 308 comprises germanium, the selective etch process used to form the trench 912 can comprise a wet chemical etching process that uses an etchant, such as tetramethylammonium hydroxide (TMAH), ammonium hydroxide (NH$_4$OH), ethylenediamine pyrocatechol (EDP), potassium hydroxide (KOH), or any other suitable etchant capable of selectively etching silicon over silicon germanium.

Figure 14:
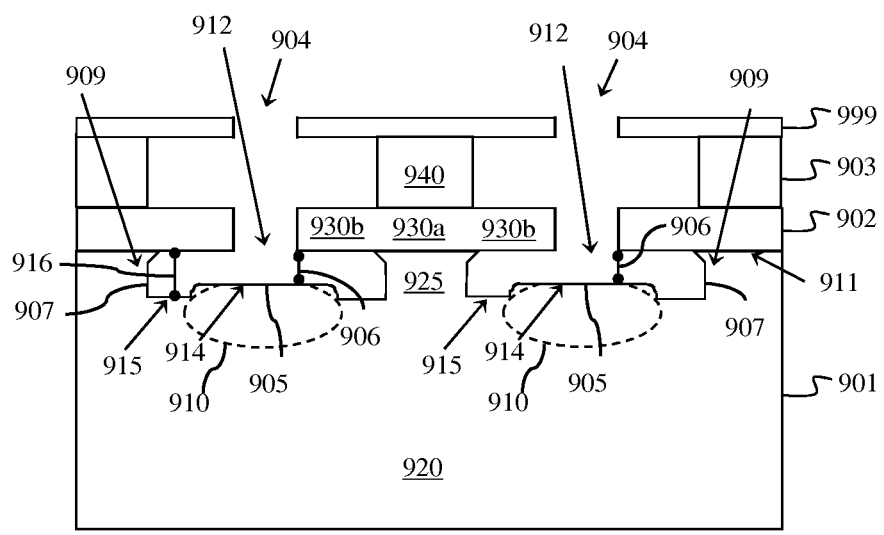
FIG. 14 is a cross-section diagram illustrating an alternative completed trench formed according to the flow diagram of FIG. 8.

It should be noted that depending upon the specifications used for this second etch process 810 and, particularly, depending upon the amount of time the sidewalls 907 of the opening 904 within the semiconductor substrate 901 are exposed to the particular etchant used such that those sidewalls 907 are etched laterally to or beyond the boundaries of the doped region 910, the shape of the trench 912 may vary. For example, if the sidewalls 907 of the opening 904 within the semiconductor substrate 901 are only exposed to the etchant until such time as the trench 912 extends laterally to or just beyond the boundaries of the doped region 910, essentially no vertical etch will occur and the bottom surface 905 of the trench 912 will have an essentially uniform depth 906, as shown in FIG. 13. However, if the sidewalls 907 of the opening 904 within the semiconductor substrate 901 are exposed to the etchant for some time after the trench 912 extends laterally beyond the boundaries of the doped region 910, at least some vertical etch will occur at the outer edges of the trench 912 such that the bottom surface 905 of the trench 912 will have a non-uniform depth, as shown in FIG. 14. Specifically, the trench 912 will have a center portion 914 extending a first depth 906 into the semiconductor substrate 901 and edges portions 915 extending a second depth 916 into the semiconductor substrate 901, where the second depth 916 is greater than the first depth 906. In any case, the second depth 916 (i.e., the maximum depth) of the trench 912 will still be less than the width such that a relatively high aspect ratio is maintained.

Figure 15:
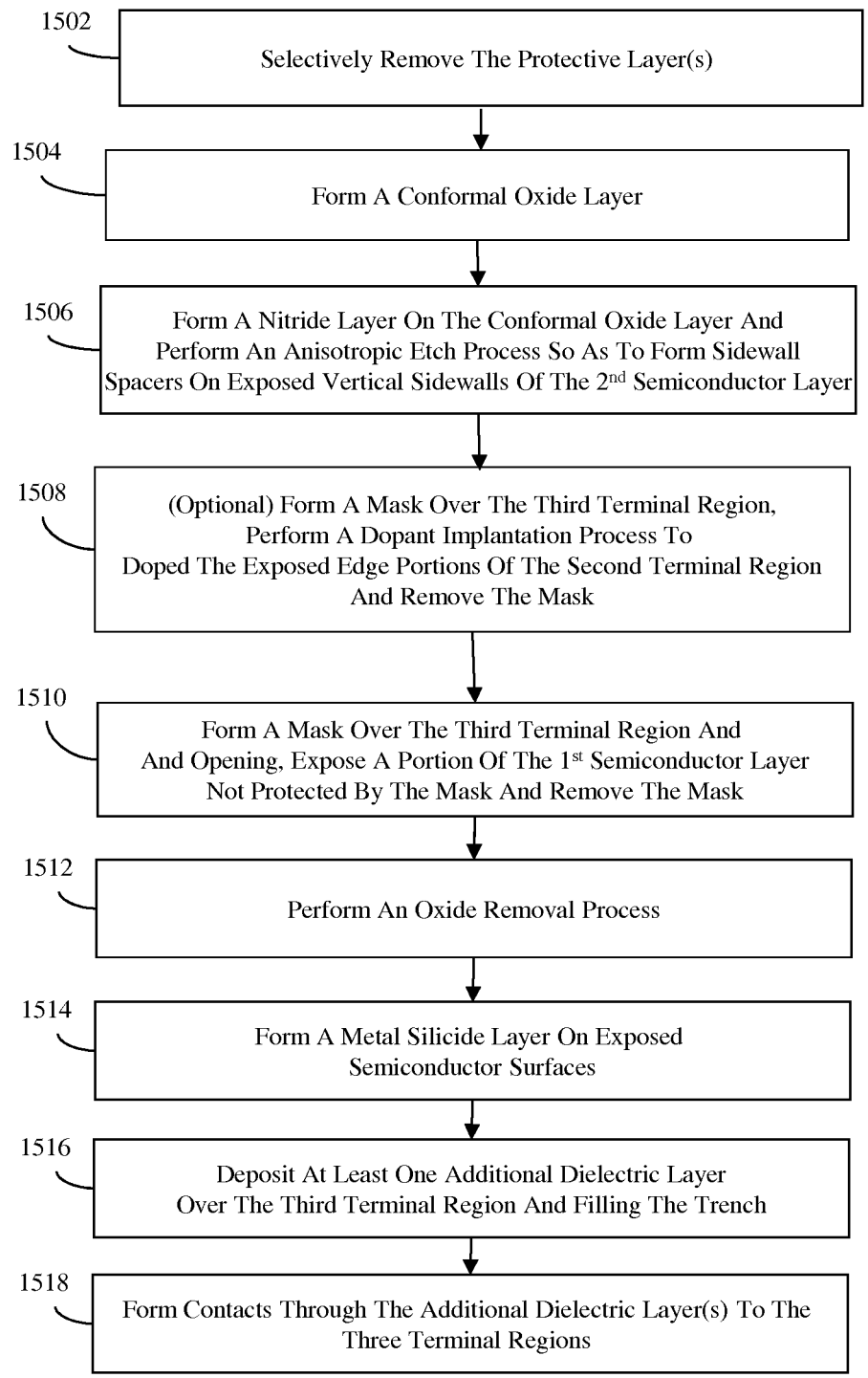
FIG. 15 is a flow diagram further detailing the additional process steps required to complete the bipolar semiconductor device structure.

After the trench 912 is formed, additional processing steps can be performed in order to complete the bipolar semiconductor device structure, which includes a trench isolation region formed using the trench 912 (812). FIG. 15 is a flow diagram describing in greater detail exemplary additional process steps 812 that can be performed in order to complete a bipolar semiconductor device structure. For purposes of illustration, these additional processing steps are shown with respect to the partially completed structure of FIG. 14. However, it should be understood that these same processing steps could be performed with respect to the partially completed structure of FIG. 13.

Figure 16:
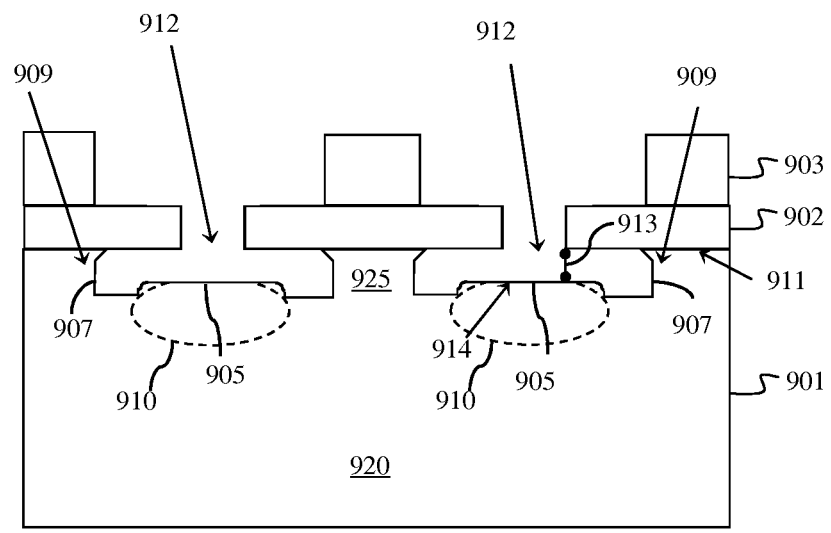
FIG. 16 is a cross-section diagram illustrating a partially completed structure formed according to the flow diagram of FIG. 15.
Figure 17:
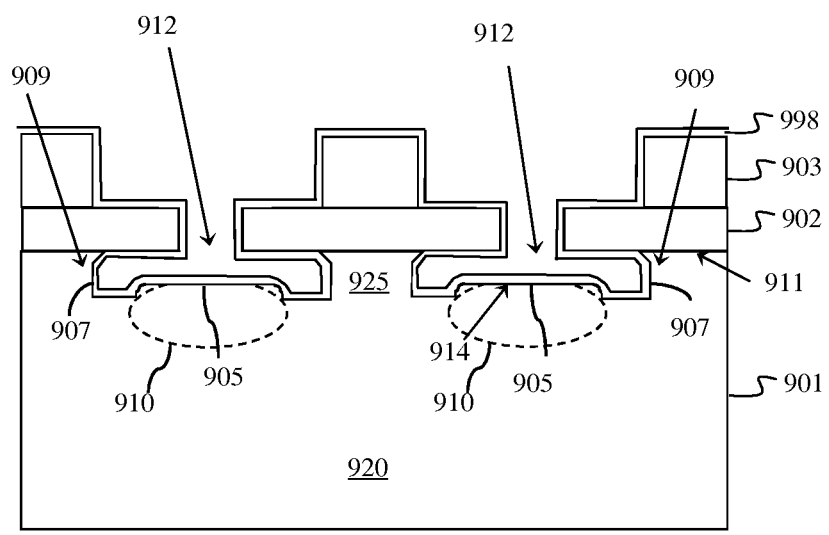
FIG. 17 is a cross-section diagram illustrating a partially completed structure formed according to the flow diagram of FIG. 15.

Specifically, the protective layer(s) 999 can be selectively removed (1502, see FIG. 16). For example, a reactive ion etch process can be used to etch a silicon nitride protective layer selectively over the semiconductor material of the second semiconductor layer 903, first semiconductor layer 902 and semiconductor substrate 901. Next, a conformal oxide layer 998 (e.g., a silicon dioxide layer) can be formed (e.g., by thermal oxidation or chemical vapor deposition (CVD)) over the partially completed structure and lining the trench 912 so as to passivize the exposed semiconductor surfaces of the semiconductor substrate 901, first semiconductor layer 902 and second semiconductor layer 903 (1504, see FIG. 17).

Figure 18:
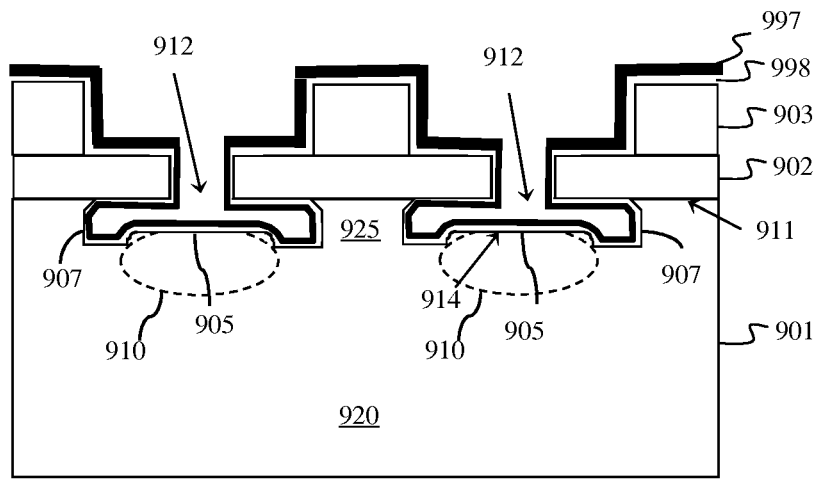
FIG. 18 is a cross-section diagram illustrating a partially completed structure formed according to the flow diagram of FIG. 15.
Figure 19:
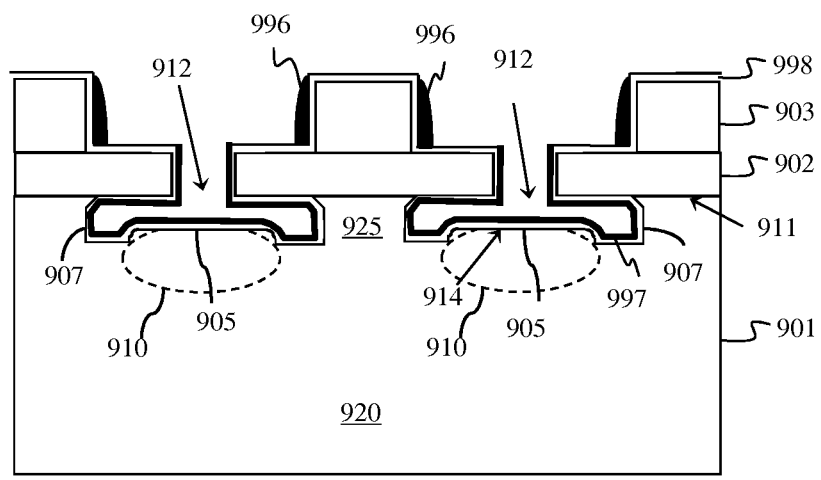
FIG. 19 is a cross-section diagram illustrating a partially completed structure formed according to the flow diagram of FIG. 15.

After the conformal oxide layer 998 is formed at process 1504, dielectric sidewall spacers 996 can be formed on the vertical sidewalls of the second semiconductor layer 903 using conventional sidewall spacer formation techniques (1506, see FIGS. 18-19). For example, to form the dielectric sidewall spacers 996, a conformal silicon nitride layer 997 can be deposited (e.g., by chemical vapor deposition (CVD) or plasma-enhanced chemical vapor deposition (PECVD)) on the conformal oxide layer 998 (see FIG. 18). Then, an anisotropic etch process can be performed so as to expose the horizontal surfaces of the conformal oxide layer 998, particularly, on the first semiconductor layer 902 and the second semiconductor layer 903, thereby forming the sidewall spacers 996 (see FIG. 19).

Optionally, a mask can be formed (e.g., lithographically patterned and etched) over the third terminal region 940 only such that the extrinsic base portion 930b of the base region 930 remains exposed. Then, a dopant implantation process can be performed so as to alter the doping profile of the extrinsic base portion 930b as compared to the intrinsic base portion 930a (1508). For example, this extrinsic base portion 930b can be implanted with a first type conductivity dopant (e.g., a P-type dopant) such that it has the first type conductivity (e.g., P-type conductivity) a relatively high first type conductivity level as compared to the intrinsic base portion 930a and/or the semiconductor substrate 901. After this extrinsic base dopant implantation process is performed, this mask can be removed.

Figure 20:
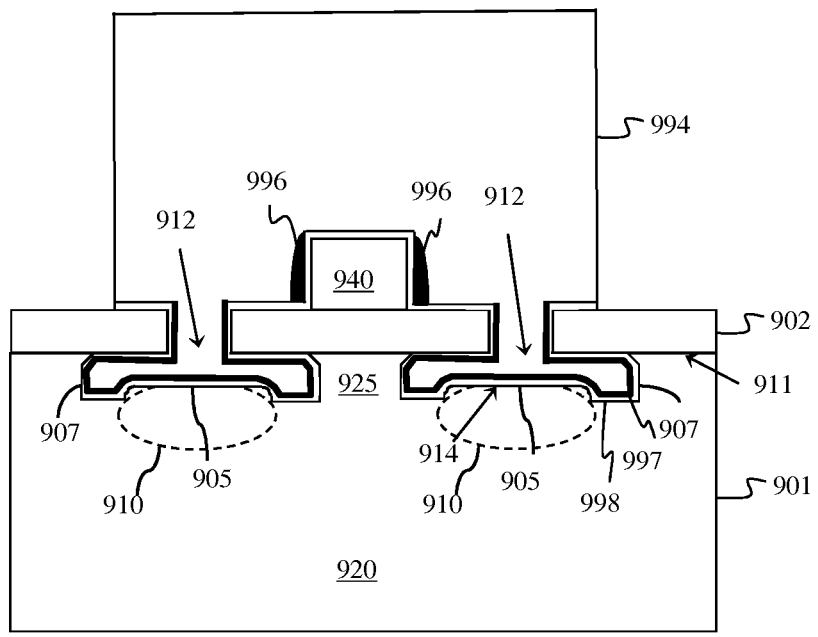
FIG. 20 is a cross-section diagram illustrating a partially completed structure formed according to the flow diagram of FIG. 15.
Figure 21:
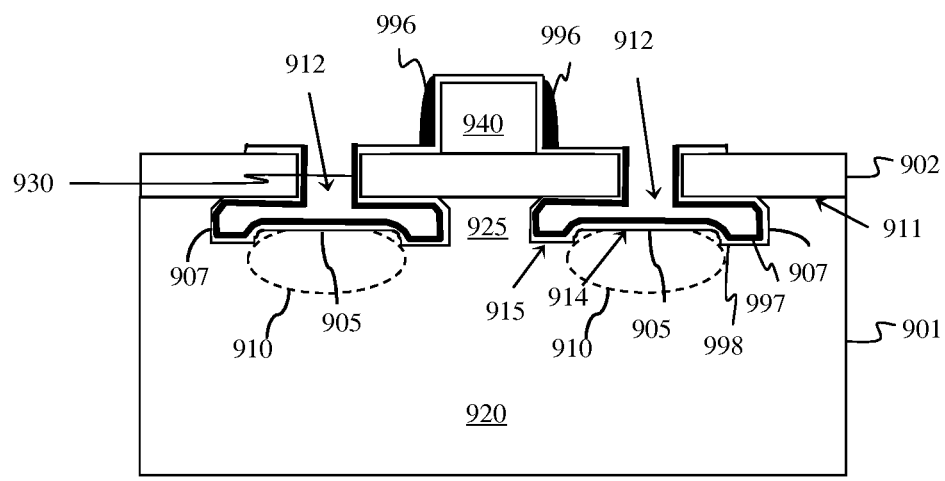
FIG. 21 is a cross-section diagram illustrating a partially completed structure formed according to the flow diagram of FIG. 15.

Then, another mask 994 can be formed (e.g., lithographically patterned and etched) such that it covers the third terminal region 940 and such that it further extends laterally beyond the opening 904 for the trench 912 (e.g., to approximately the outer edge of the trench 912). Once the mask 994 is formed, a portion of the first semiconductor layer 902 not protected by the mask 994 can be exposed (e.g., using a non-selective reactive ion etch process) and the mask 994 can be removed (1510, see FIGS. 20-21). This exposed portion of the first semiconductor layer 902 can subsequently be the site for formation at process 1518 (see detailed discussion below) of a contact to the first terminal region 920.

Figure 22:
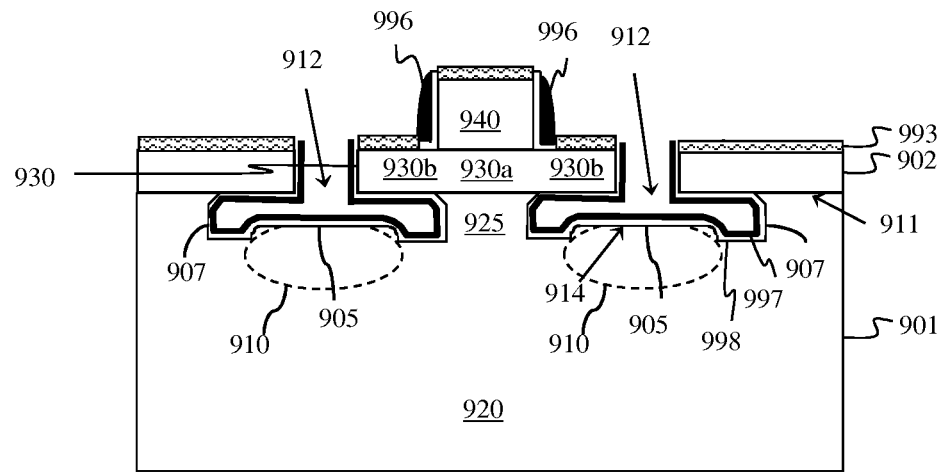
FIG. 22 is a cross-section diagram illustrating a partially completed structure formed according to the flow diagram of FIG. 15.

Next, an oxide removal process can be performed (e.g., using a conventional aqueous hydrofluoric acid (HF) solution or a chemical oxide removal (COR) process) to clean the exposed horizontal surfaces of the first semiconductor layer 902 and the second semiconductor layer 903 (1512). Following this oxide removal process 1512, a metal silicide layer 993 can be formed on the exposed horizontal surfaces of the first semiconductor layer 902 and the second semiconductor layer 903 (1514, see FIG. 22). The metal silicide layer 993 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. Techniques for forming a metal silicide layer are well known in the art and, thus, the details of these techniques are omitted from this specification in order to allow the reader to focus on the salient aspects of the disclosed method.

Subsequently, one or more additional dielectric layer(s) 992 can be formed so as to blanket the structure (1516, see FIG. 23). These additional dielectric layer(s) 992 can cover the third terminal region 940 and extend laterally over the rest of the structure, filling the trench 912 so as to complete the trench isolation region 990 and further filling the opening 904. These additional dielectric layer(s) 992 can comprise, for example, any suitable interlayer dielectric material(s). For example, the additional dielectric layer(s) 992 can comprise any of silicon oxide ($SiO_x$), silicon nitride ($SiN_x$), borophosphosilicate glass (BPSG), etc. Finally, contacts 991 can be formed that extend vertically through the dielectric layer(s) 992 in order to contact the three terminals 920, 930 and 940 (e.g., the collector region, the extrinsic base portion of the base region and the emitter region), thereby completing the bipolar semiconductor device 900 (1518, see FIG. 23). Techniques for forming such additional dielectric layer(s) and contacts are well known in the art and, thus, the details of these techniques are omitted from this specification in order to allow the reader to focus on the salient aspects of the disclosed method.

It should be noted that, in the method described above, the bipolar semiconductor device 900 is formed so as to have an emitter-up configuration (i.e., a configuration where the first terminal region 920 is the collector region, the second terminal region 930 is the base region and the third terminal region 940 is the emitter region). In such a bipolar semiconductor device, the trench isolation region 990 with the relatively high aspect ratio ensures that collector-to-base capacitance $C_{cb}$ and collector resistance $R_c$ are both minimized. It should, however, be understood that, alternatively, this bipolar semiconductor device 900 can be formed so as to have a collector-up configuration (i.e., a configuration where the first terminal region 920 is the emitter region, the second terminal region 930 is the base region and the third terminal region 940 is the collector region). In such a bipolar semiconductor device, the trench isolation region 990 with the relatively high aspect ratio would ensure that emitter-to-base capacitance $C_{eb}$ and emitter resistance $R_e$ are both minimized.

Figure 23:
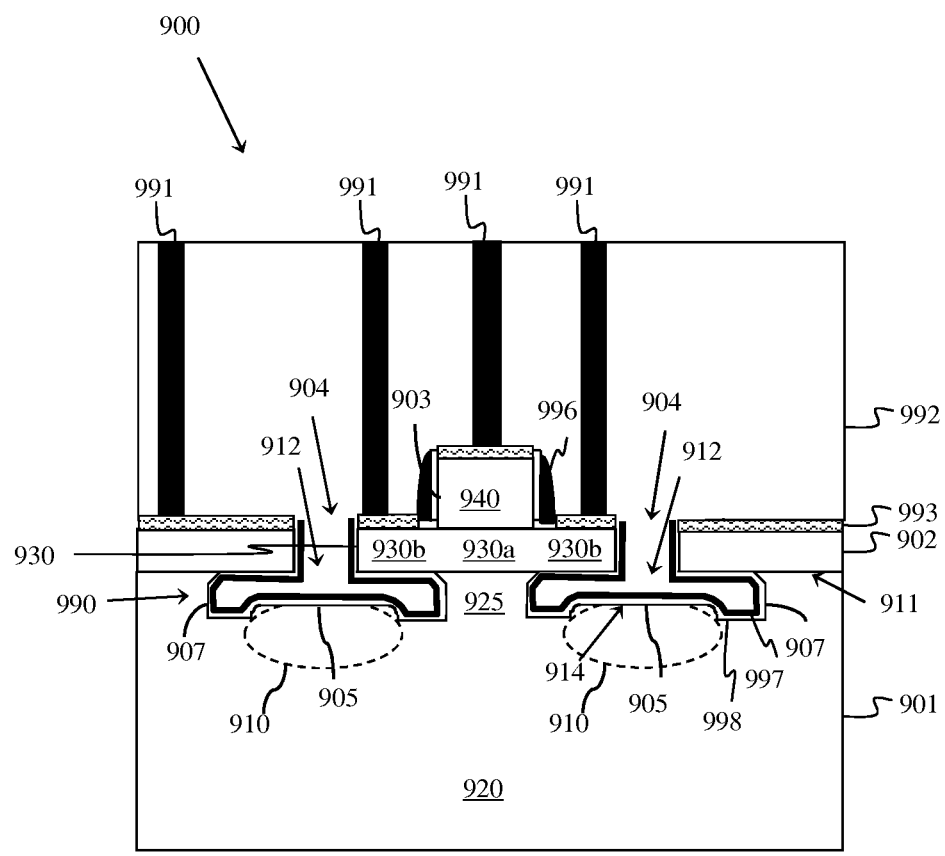
FIG. 23 is a cross-section diagram illustrating a completed structure formed according to the flow diagram of FIG. 15.

Referring to FIG. 23, also disclosed herein is a bipolar semiconductor device 900, such as a bipolar junction transistor (BJT) or heterojunction bipolar transistor (HBT), formed according to the method described above. Specifically, this bipolar semiconductor device 900 can comprise a semiconductor substrate 901 and a first terminal region 920 (e.g., a collector region) in the semiconductor substrate 901. This semiconductor substrate 901 can comprise a bulk semiconductor substrate, as illustrated in FIG. 23. Alternatively, the semiconductor substrate 901 can comprise a semiconductor-on-insulator (SOI) wafer (not shown). In any case, the semiconductor substrate 901 (or in the case of an SOI wafer, the top layer of the SOI wafer) can comprise a first semiconductor material (e.g., monocrystalline silicon or any other suitable semiconductor material) having a first type conductivity (e.g., a P-type conductivity). Thus, for example, the semiconductor substrate 901 can comprise a P-silicon substrate (i.e., a silicon substrate having a relatively low concentration of a P-type dopant). The first terminal region 920 can comprise, for example, a well region (e.g., a dopant implant region) within the semiconductor substrate 901. This well region can have a second type conductivity that is different from the first type conductivity (e.g., such that it comprises an N-well region having an N-type conductivity).

The bipolar semiconductor device 900 can further comprise, on the semiconductor substrate 901, a first semiconductor layer 902. Specifically, the first semiconductor layer 902 can comprise a second semiconductor material that is different from the first semiconductor material. For example, if the first semiconductor material of the semiconductor substrate 901 comprises monocrystalline silicon, the second semiconductor material of the first semiconductor layer 902 can comprise silicon germanium, silicon carbide, or silicon germanium carbide.

This first semiconductor layer 902 can comprise a second terminal region 930 (e.g., a base region) aligned above the first terminal region 920 within the semiconductor substrate 901. This base region 930 can comprise an intrinsic base portion 930a and an extrinsic base portion 930b positioned laterally adjacent to and, particularly, laterally surrounding the intrinsic base portion 930a. The intrinsic base portion 930a can be undoped. Alternatively, this intrinsic base portion can be doped with a relatively low concentration of a first type conductivity dopant (e.g., a P-type dopant) and, thereby such that it has the same type conductivity as the semiconductor substrate 901 (e.g., P-type conductivity). Alternatively, this intrinsic base portion 930a can be doped so that it has a relatively thin un-doped lower portion that it has neither N-type, nor P-type conductivity and an upper portion that is doped with a relatively low concentration of a first type conductivity dopant (e.g., a P-type dopant). The extrinsic base portion 930b can have the same doping profile as the intrinsic base portion 930a. Alternatively, the extrinsic base portion 930b can be doped with a relatively high concentration of a first type conductivity dopant (e.g., a P-type dopant) such that the extrinsic base portion 930b has the same conductivity type at a higher level than the semiconductor substrate 901 and/or the intrinsic base portion 930a.

The bipolar semiconductor device 900 can further comprise a second semiconductor layer 903 on the first semiconductor layer 902 aligned above base region 930. This second semiconductor layer 903 can comprise a third terminal region 940 (e.g., an emitter region) and can be narrower than the base region 930 such that the third terminal region 940 is vertically aligned above only the intrinsic base portion 930a of that base region 930 (i.e., such that the extrinsic base portion 930b extends laterally beyond the third terminal region 940). This second semiconductor layer 903 can comprise, for example, the same first semiconductor material as the semiconductor substrate 901. The third terminal region 940 can be doped with a second type conductivity dopant (e.g., an N-type dopant) and, thereby such that it has the same type conductivity as the first terminal region 920 within the semiconductor substrate 901 (e.g., N-type conductivity).

One or more sidewall spacers 996 can be positioned laterally adjacent to vertical sidewalls of the third terminal region 940. These sidewall spacer(s) 996 can comprise, for example, a first sidewall spacer (e.g., a silicon dioxide sidewall spacer) immediately adjacent to the third terminal region 940 and a second sidewall spacer (e.g., a silicon nitride sidewall spacer) positioned laterally adjacent to the first sidewall spacer.

The bipolar semiconductor device 900 can further comprise a metal silicide layer 993 on the top surface of the second semiconductor layer 903 and, particularly, on the top surface of the third terminal region 940 and also on the top surface of the first semiconductor layer 902 such that the metal silicide layer 993 is positioned laterally adjacent to the sidewall spacers 996. This metal silicide layer 993 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof.

The bipolar semiconductor device 900 can further comprise an opening 904, which extends vertically through the metal silicide layer 993 and the first semiconductor layer 902 and which is further positioned laterally adjacent to the second terminal region 930. Specifically, this opening 904 can laterally surround and, thereby define the limits of the second terminal region 930.

The bipolar semiconductor device 900 can further comprise a trench 912, which is in the semiconductor substrate 901 aligned below the opening 904. This trench 912 can further be positioned laterally adjacent to the first terminal region 920 and, particularly, can define a relatively narrow first terminal pedestal 925 (e.g., a relatively narrow collector pedestal) at the top surface of the semiconductor substrate 901 aligned below the intrinsic base portion 930a of the base region 930. This trench 912 can be wider than the opening 904 such that it undercuts the first semiconductor layer 902 and, particularly, such that it undercuts the extrinsic base portion 930b of the base region 930. This trench 912 can further have a relatively high aspect ratio. That is, the depth of the trench can be less than its width. More specifically, as discussed in detail above with regard to the method of forming the bipolar semiconductor device 900, the bottom surface 905 of the trench 912 can have an essentially uniform depth 906, which is greater than its width 913, as shown in FIG. 13, such that the trench 912 has a relatively high aspect ratio. Alternatively, as shown in FIG. 14 (and in FIG. 23), the trench 912 can have a center portion 914 that extends a first depth 906 into the semiconductor substrate 901 and edge portions 915 that extend a second depth 916 into the semiconductor substrate 901, where the second depth 916 is greater than the first depth 906. In any case, the second depth 916 (i.e., the maximum depth) of the trench 912 will still be less than the width 913 such that the trench 912 has a relatively high aspect ratio.

One or more isolation materials can fill the trench 912, thereby forming a trench isolation region 990. The isolation material(s) can also fill the opening 904 in the first semiconductor layer 902 above the trench 912. For example, the trench 912 and opening 904 can be lined with a relatively thin silicon dioxide layer 998. A relatively thin silicon nitride layer 997 can cover the silicon dioxide layer 998 and an additional dielectric layer 992 (e.g., a borophosphosilicate glass (BPSG) layer or other suitable dielectric layer) can fill the remaining portions of the trench 912 and opening 904. This additional dielectric layer 992 can further cover the metal silicide layer 993. Contacts 991 can extend vertically through the additional dielectric layer 992 to contact the three terminal regions 920, 930 and 940 (e.g., the collector region, the extrinsic base portion of the base region and the emitter region) of the bipolar semiconductor device 900.

The bipolar semiconductor device 900 can further comprise a doped region 910 in the semiconductor substrate 901 aligned below and immediately adjacent to the bottom surface 905 of the trench 912. As discussed in detail above with regard to the method, this doped region 910 ensures that the high aspect ratio of the trench 912 is maintained during an etch process used to undercut the extrinsic base portion 930b of the base region 930. Specifically, this doped region 910 can be doped with a dopant, which is preselected to ensure that undoped regions of the semiconductor substrate 901 at the trench sidewalls 907 can be selectively etched over the doped region 910 and, thereby so that the trench sidewalls 907 can be etched back without further etching the bottom surface 905 of the trench 912. For example, if the semiconductor substrate 901 and second semiconductor layer 903 comprise silicon and the first semiconductor layer 902 comprises silicon germanium, the dopant in the doped region 910 can comprise germanium. Alternatively, the dopant in the doped region 910 could comprise, for example, an inert dopant (e.g., silicon, argon, krypton, nitrogen, xenon, neon, carbon, etc.) selected so that the required selective etch could be performed. Alternatively, the dopant in the doped region 910 can comprise a dopant associated with either N-type or P-type conductivity (e.g., arsenic or boron, respectively) selected so that the required selective etch could be performed.

It should be noted that the bipolar semiconductor device 900, as described above, has an emitter-up configuration (i.e., a configuration where the first terminal region 920 is the collector region, the second terminal region 930 is the base region and the third terminal region 940 is the emitter region). In such a bipolar semiconductor device, the trench isolation region 990 with the relatively high aspect ratio ensures that collector-to-base capacitance $C_{cb}$ and collector resistance $R_c$ are both minimized. It should, however, be understood that, alternatively, the bipolar semiconductor device 900 can have a collector-up configuration (i.e., a configuration where the first terminal region 920 is the emitter region, the second terminal region 930 is the base region and the third terminal region 940 is the collector region). In such a bipolar semiconductor device, the trench isolation region 990 with the relatively high aspect ratio would ensure that emitter-to-base capacitance $C_{eb}$ and emitter resistance $R_e$ are both minimized.

It should further be noted that in the methods and bipolar semiconductor device structures described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should further be noted that the terminology used herein is for the purpose of describing disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is an improved technique for forming a trench for a trench structure (e.g., a trench isolation region) within a semiconductor substrate aligned below an opening in a semiconductor layer such the trench has a relatively high aspect ratio (i.e., such that the trench has a width that is greater than its depth). With this technique, a first etch process is used to form an opening through the semiconductor layer into the semiconductor substrate. Then, a second etch process is used to expand the lower portion of the opening within the semiconductor substrate, thereby forming the trench. However, prior to performing the second etch process, a doped region is formed in the semiconductor substrate immediately adjacent to the bottom surface of the opening. Then, the second etch process is specifically performed such that an undoped region of the semiconductor substrate immediately adjacent to the sidewalls of the opening is etched at a faster etch rate than the doped region, thereby ensuring that the resulting trench has a relatively high aspect ratio. Also disclosed herein is a method of forming a semiconductor device and, particularly, a bipolar semiconductor device, such as a bipolar junction transistor (BJT) or heterojunction bipolar transistor (HBT). This method incorporates the above-mentioned trench formation technique when forming a trench isolation region around a collector pedestal so that the trench isolation region has a relatively high aspect ratio and, thereby so that collector-to-base capacitance $C_{cb}$ and collector resistance $R_c$ within the resulting bipolar semiconductor device are both minimized.

What is claimed is:

1. A method comprising:
   providing a semiconductor substrate;
   depositing a semiconductor layer on a top surface of said semiconductor substrate;
   performing a first etch process to form an opening extending vertically through said semiconductor layer into said semiconductor substrate such that said opening has sidewalls and a bottom surface within said semiconductor substrate, said semiconductor substrate comprising a first semiconductor material and said semiconductor layer comprising a second semiconductor material different from said first semiconductor material;
   implanting a dopant into said semiconductor substrate to form a doped region immediately adjacent to said bottom surface of said opening; and
   performing a second etch process such that an undoped region of said semiconductor substrate immediately adjacent to said sidewalls is etched at a faster etch rate than said semiconductor layer and said doped region in order to form a trench within said semiconductor substrate below said semiconductor layer.

2. The method of claim 1, said faster etch rate of said undoped region ensures that, after said second etch process, said trench has a relatively high aspect ratio with a depth of said trench being less than a width of said trench.

3. The method of claim 1, said trench having a center portion extending a first depth into said semiconductor substrate and edges portions extending a second depth into said semiconductor substrate, said second depth being greater than said first depth.

4. The method of claim 1, said first semiconductor material comprising silicon and said second semiconductor material comprising a silicon germanium.

5. The method of claim 1, said dopant comprising any of germanium, boron, arsenic, argon, neon, and silicon.

6. The method of claim 1, said second etch process having an etch selectivity of approximately 5:1 to 200:1 for said undoped region over said doped region.

7. The method of claim 1, further comprising, before said forming of said opening, forming at least one protective layer on said semiconductor layer such that, during said implanting, said semiconductor layer is protected from dopant implantation.

8. The method of claim 1, further comprising filling said trench with at least one isolation material to form a trench isolation region.

9. A method comprising:
providing a semiconductor substrate;
forming a first semiconductor layer on said semiconductor substrate;
forming a second semiconductor layer on said first semiconductor layer, said semiconductor substrate and said second semiconductor layer comprising a first semiconductor material and said first semiconductor layer comprising a second semiconductor material that is different from said first semiconductor material;
performing a first etch process so as to form an opening extending vertically through said second semiconductor layer and said first semiconductor layer into said semiconductor substrate such that said opening has sidewalls and a bottom surface within said semiconductor substrate;
implanting a dopant into said semiconductor substrate to form a doped region immediately adjacent to said bottom surface of said opening;
performing a second etch process such that said second semiconductor layer and an undoped region of said semiconductor substrate immediately adjacent to said sidewalls are etched at a faster etch rate than said first semiconductor layer and said doped region in order to form a trench within said semiconductor substrate below said first semiconductor layer; and
after said forming of said trench, filling said trench with at least one isolation material in order to form a trench isolation region.

10. The method of claim 9, said faster etch rate of said undoped region ensures that, after said second etch process, said trench has a relatively high aspect ratio with a depth of said trench being less than a width of said trench.

11. The method of claim 9, said trench having a center portion extending a first depth into said semiconductor substrate and edges portions extending a second depth into said semiconductor substrate, said second depth being greater than said first depth.

12. The method of claim 9, said first semiconductor material comprising silicon and said second semiconductor material comprising a silicon germanium.

13. The method of claim 9, said dopant comprising any of germanium, boron, arsenic, argon, neon, and silicon.

14. The method of claim 9, said second etch process having an etch selectivity of approximately 5:1 to 200:1 for said undoped region over said doped region.

15. The method of claim 9, further comprising, before said forming of said opening, forming at least one protective layer on said second semiconductor layer such that, during said implanting, said second semiconductor layer is protected from dopant implantation.

16. The method of claim 9, further comprising:
before said forming of said first semiconductor layer, forming a first terminal region for a bipolar semiconductor device in said semiconductor substrate, said trench being formed so as to be positioned laterally adjacent to said first terminal region; and
after said forming of said trench, forming a second terminal region for said bipolar semiconductor device in said first semiconductor layer above said first terminal region and a third terminal region for said bipolar semiconductor device in said second semiconductor layer above said second terminal region.

17. A method comprising:
performing a first etch process to form an opening extending vertically through a semiconductor layer into a semiconductor substrate such that said opening has sidewalls and a bottom surface within said semiconductor substrate, said semiconductor substrate comprising silicon and said semiconductor layer comprising silicon germanium;
implanting a dopant into said semiconductor substrate to form a doped region immediately adjacent to said bottom surface of said opening; and
performing a second etch process such that an undoped region of said semiconductor substrate immediately adjacent to said sidewalls is etched at a faster etch rate than said semiconductor layer and said doped region in order to form a trench within said semiconductor substrate below said semiconductor layer.

18. The method of claim 17, said faster etch rate of said undoped region ensures that, after said second etch process, said trench has a relatively high aspect ratio with a depth of said trench being less than a width of said trench.

19. The method of claim 17, said trench having a center portion extending a first depth into said semiconductor substrate and edges portions extending a second depth into said semiconductor substrate, said second depth being greater than said first depth.

* * * * *